(12) United States Patent
Yoshimura et al.

(10) Patent No.: US 10,811,523 B2
(45) Date of Patent: Oct. 20, 2020

(54) VERTICAL MOSFET HAVING INSULATED TRENCHES AND BASE REGION CONTACT

(71) Applicant: ABLIC Inc., Chiba-shi, Chiba (JP)

(72) Inventors: Mitsuhiro Yoshimura, Chiba (JP); Masahiro Hatakenaka, Chiba (JP)

(73) Assignee: ABLIC INC., Chiba (JP)

( * ) Notice: Subject to any disclaimer, the term of this patent is extended or adjusted under 35 U.S.C. 154(b) by 45 days.

(21) Appl. No.: 15/936,723

(22) Filed: Mar. 27, 2018

(65) Prior Publication Data

US 2018/0286970 A1    Oct. 4, 2018

(30) Foreign Application Priority Data

Mar. 28, 2017   (JP) ................................ 2017-063389

(51) Int. Cl.
| | |
|---|---|
| *H01L 29/739* | (2006.01) |
| *H01L 29/78* | (2006.01) |
| *H01L 29/10* | (2006.01) |
| *H01L 29/06* | (2006.01) |
| *H01L 29/66* | (2006.01) |
| *H01L 29/417* | (2006.01) |

(52) U.S. Cl.
CPC ...... *H01L 29/7397* (2013.01); *H01L 29/0696* (2013.01); *H01L 29/1095* (2013.01); *H01L 29/417* (2013.01); *H01L 29/41766* (2013.01); *H01L 29/66348* (2013.01); *H01L 29/66734* (2013.01); *H01L 29/7396* (2013.01); *H01L 29/7813* (2013.01)

(58) Field of Classification Search
CPC ............. H01L 29/7813; H01L 29/7397; H01L 29/1095; H01L 29/0696; H01L 29/417; H01L 29/41766; H01L 29/66348; H01L 29/66734; H01L 29/7396
USPC ....................................................... 257/586
See application file for complete search history.

(56) References Cited

U.S. PATENT DOCUMENTS

| | | | | |
|---|---|---|---|---|
| 3,054,034 A | * | 9/1962 | Nelson ................... | H01L 21/22 257/586 |
| 5,378,911 A | * | 1/1995 | Murakami ............ | H01L 29/739 257/334 |
| 5,457,329 A | * | 10/1995 | Harada ................. | H01L 29/749 257/153 |

(Continued)

FOREIGN PATENT DOCUMENTS

JP          2003-101027 A      4/2003

*Primary Examiner* — Allen L Parker
*Assistant Examiner* — Charles N Ausar-El
(74) *Attorney, Agent, or Firm* — Brinks Gilson & Lione

(57) ABSTRACT

A semiconductor device having a first surface formed at a first height and a second surface formed at a second height on a semiconductor substrate includes: a base region formed in the semiconductor substrate; a trench formed from the first surface and the second surface into the semiconductor substrate; a gate insulating film covering an inner side of the trench; a gate electrode embedded to a third height; an insulating film formed on the gate electrode; a first region which has the first surface and in which a base contact region is formed; and a second region which has the second surface and in which a source region is formed, the first region and the second region being alternately arranged in the trench extension direction to prevent a reduction in channel formation density.

7 Claims, 15 Drawing Sheets

(56) References Cited

U.S. PATENT DOCUMENTS

| | | | | |
|---|---|---|---|---|
| 6,359,306 B1* | 3/2002 | Ninomiya | H01L 29/7825 | 257/328 |
| 7,122,860 B2* | 10/2006 | Peake | H01L 23/49562 | 257/339 |
| 7,358,565 B2* | 4/2008 | Harada | H01L 29/0834 | 257/330 |
| 8,334,541 B2* | 12/2012 | Miyahara | H01L 29/0696 | 257/77 |
| 8,637,959 B2* | 1/2014 | Qian | H01L 21/76224 | 257/197 |
| 10,121,862 B2* | 11/2018 | Kurokawa | H01L 29/0619 | |
| 10,453,957 B2* | 10/2019 | Kobayashi | H01L 29/1095 | |
| 2002/0153558 A1* | 10/2002 | Takemori | H01L 29/7813 | 257/330 |
| 2005/0167742 A1* | 8/2005 | Challa | H01L 21/3065 | 257/328 |
| 2006/0214221 A1* | 9/2006 | Challa | H01L 21/3065 | 257/328 |
| 2007/0215981 A1* | 9/2007 | Schulze | H01L 29/0696 | 257/591 |
| 2009/0140329 A1* | 6/2009 | Yoshimochi | H01L 29/4941 | 257/330 |
| 2012/0012860 A1* | 1/2012 | Miyahara | H01L 29/0696 | 257/77 |
| 2012/0104555 A1* | 5/2012 | Bobde | H01L 29/0696 | 257/587 |
| 2012/0319136 A1* | 12/2012 | Noborio | H01L 29/1095 | 257/77 |
| 2013/0175574 A1* | 7/2013 | Matsuura | H01L 29/66348 | 257/139 |
| 2013/0248924 A1* | 9/2013 | Matsudai | H01L 29/7397 | 257/139 |
| 2016/0359026 A1* | 12/2016 | Matsuura | H01L 29/7397 | |
| 2017/0077274 A1* | 3/2017 | Naito | H01L 29/7397 | |
| 2017/0365709 A1* | 12/2017 | Ohashi | B66B 25/00 | |
| 2018/0083137 A1* | 3/2018 | Kobayashi | H01L 29/7827 | |
| 2019/0067463 A1* | 2/2019 | Abe | H01L 29/7397 | |
| 2019/0097030 A1* | 3/2019 | Miyata | H01L 21/28 | |

\* cited by examiner ns, it is difficult to VERTICAL MOSFET HAVING INSULATED TRENCHES AND BASE REGION CONTACT

RELATED APPLICATIONS

This application claims priority under 35 U.S.C. § 119 to Japanese Patent Application No. 2017-063389 filed on Mar. 28, 2017, the entire content of which is hereby incorporated by reference.

BACKGROUND OF THE INVENTION

1. Field of the Invention

The present invention relates to a semiconductor device, and more particularly, to a semiconductor device that includes a vertical transistor with a trench gate.

2. Description of the Related Art

As one of related-art vertical transistors, the following vertical MOSFET is proposed and disclosed in, for example, Japanese Patent Application Laid-open No. 2003-101027. Specifically, a gate electrode is formed only in the lower part of a trench formed in a substrate, and the upper part of the trench is embedded with an insulating film for insulating a source electrode and the gate electrode from each other, so that the upper surface of the insulating film forms a plane substantially coplanar with the surface of the substrate. The source electrode is formed on the plane. This configuration eliminates a contact opening for connecting the source electrode formed on the insulating film to a source region and a base contact region of the surface of the substrate, the contact opening which is necessary in a case in which the gate electrode is embedded up to the upper part of the trench, and the insulating film is formed on the surface of the substrate. As a result, an interval between the adjacent trenches can be reduced, and the device can be downsized in its lateral direction.

In addition, in Japanese Patent Application Laid-open No. 2003-101027 (see, in particular, FIG. 2(a), FIG. 2(b), and FIG. 5), there is a disclosure that the source regions and the base contact regions are alternately arranged in the surface of the substrate along the trenches in a stripe pattern so that an interval between the adjacent trenches is reduced, with the result that the device can be further downsized in its lateral direction.

SUMMARY OF THE INVENTION

However, in the structure in which the source regions and the base contact regions are alternately arranged, a channel is not formed in the base contact region. Thus, there is a need to reduce the width of the base contact region in a trench extension direction (hereinafter the "width" in this case represents a length in the trench extension direction) in order to increase the channel formation density of the transistor in the trench extension direction. However, the inventor has found that in this structure, as illustrated in FIG. 16 (the source electrode provided on the uppermost surface is omitted in FIG. 16), an undetermined region 530 whose net impurity concentration decreased to have high resistance is formed around the PN junction between a source region 507 and a base contact region 509 due to mask alignment shift or thermal diffusion. The undetermined region 530 narrows widths of the source region 507 and the base contact region 509. Thus, there is a need to set the widths of the source region 507 and the base contact region 509 large in advance in consideration of the generation of the undetermined region 530. In view of the circumstances, it is difficult to downsize the device in the trench extension direction, and to suppress a reduction in channel formation density in the trench extension direction.

Accordingly, the present invention has an object to provide a semiconductor device which is capable of being downsized in a trench extension direction and suppressing a reduction in channel formation density in the trench extending direction.

A semiconductor device according to one embodiment of the present invention is as follows.

That is, the semiconductor device includes: a semiconductor substrate having a first surface formed at a first height and a second surface formed at a second height different from the first height; a first electrode formed on the first surface and the second surface in a contact manner; and a second electrode formed on a back surface of the semiconductor substrate in a contact manner, the semiconductor substrate including: a back surface semiconductor electrode layer of a first conductivity type formed so as to have a predetermined thickness from the back surface of the semiconductor substrate; a base region of a second conductivity type formed on the back surface semiconductor electrode layer; a trench having a depth from the first surface and the second surface to an upper surface of the back surface semiconductor electrode layer; a gate insulating film formed on a side surface and a bottom surface of the trench below a third height positioned between the second surface and the bottom surface of the trench; a gate electrode embedded into the trench to the third height along the gate insulating film; an insulating film formed on the gate insulating film and the gate electrode inside the trench, and having an upper surface positioned at any higher position of the first height and the second height; and a first region and a second region alternately arranged along the trench and having the first surface and the second surface, respectively, the first region having a base contact region of the second conductivity type which includes a portion in contact with the base region and a portion in contact with the first electrode, and which has a concentration higher than a concentration of the base region, the second region having a source region which includes a portion in contact with the base region, a portion along an outer side surface of the trench from the second surface to the third height, and a portion in contact with the first electrode.

The "base region" and the "base contact region" in the above description may be referred to as, for example, "body region" and "body contact region", respectively, but "base region" and "base contact region" are herein used.

According to the present invention, it is possible to prevent the generation of the undetermined region around the PN junction between the source region and the base contact region, thereby being capable of downsizing the device in the trench extension direction. Further, the source region required for the base contact region and channel formation is not reduced, and hence the reduction in channel formation density in the trench extension direction can be suppressed.

DETAILED DESCRIPTION OF THE EMBODIMENTS

Now, with reference to the drawings, semiconductor devices according to embodiments of the present invention are described.

Figure 1:
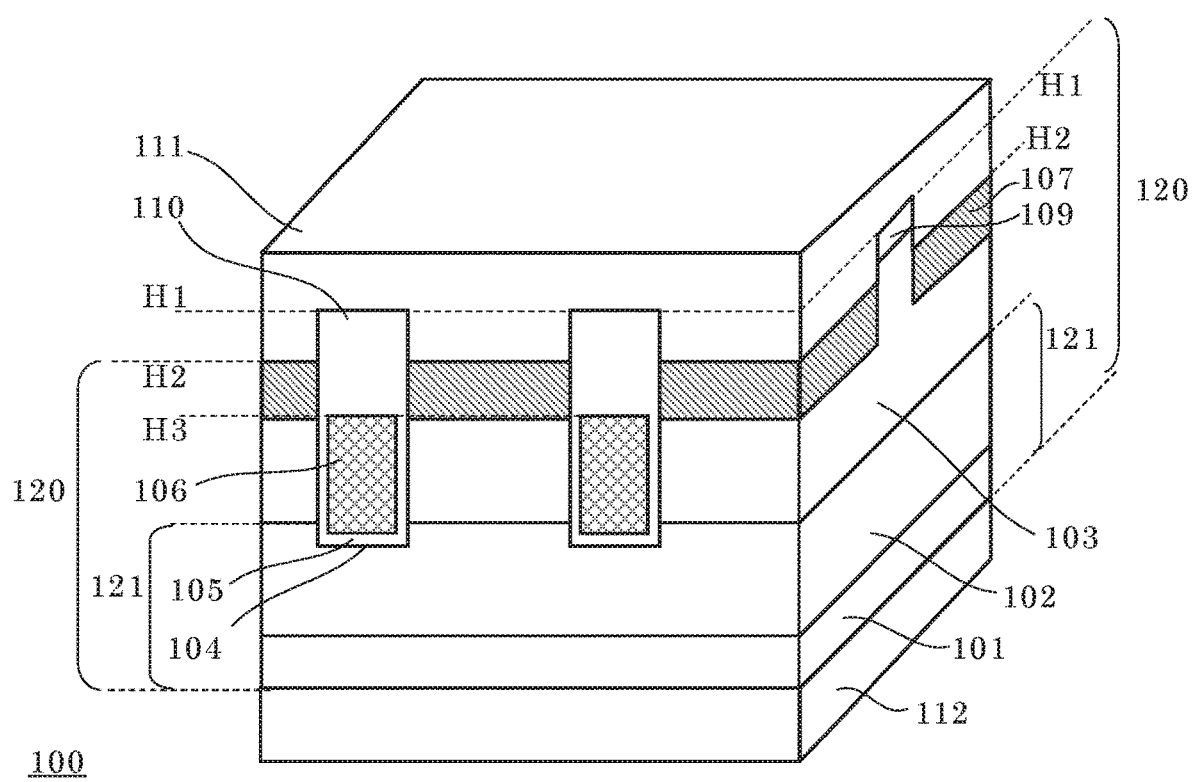
FIG. 1 is a perspective view for illustrating a structure of a semiconductor device according to a first embodiment of the present invention.
Figure 2:
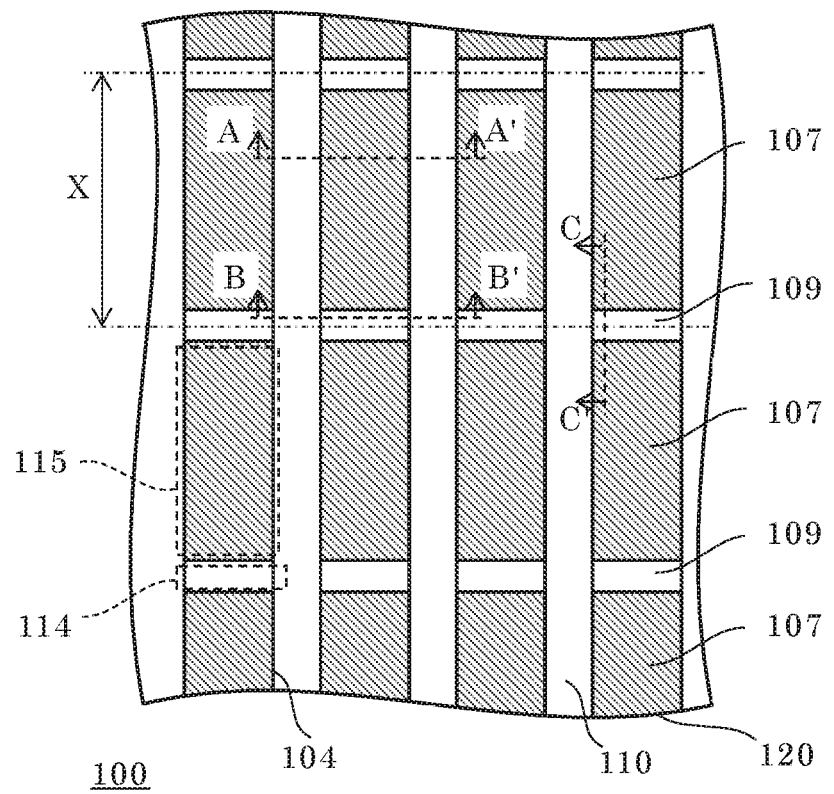
FIG. 2 is a view for illustrating a planar structure of the semiconductor device illustrated in FIG. 1.
Figure 3:
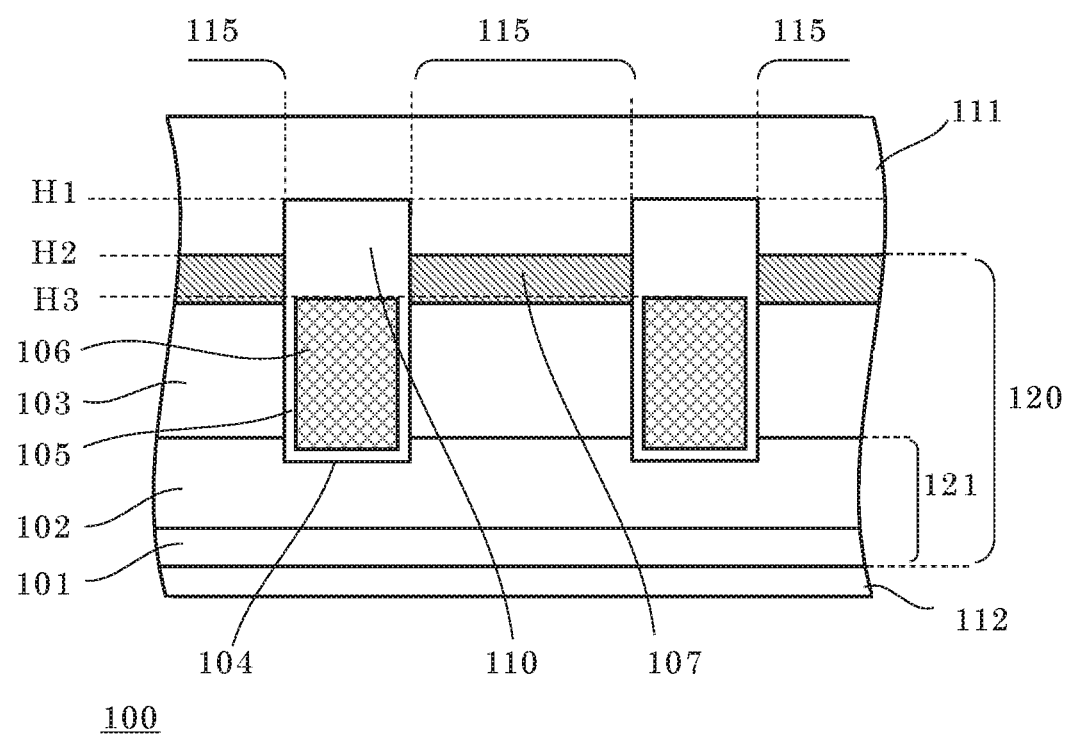
FIG. 3 is a sectional view taken along the line A-A' of the semiconductor device illustrated in FIG. 2.
Figure 4:
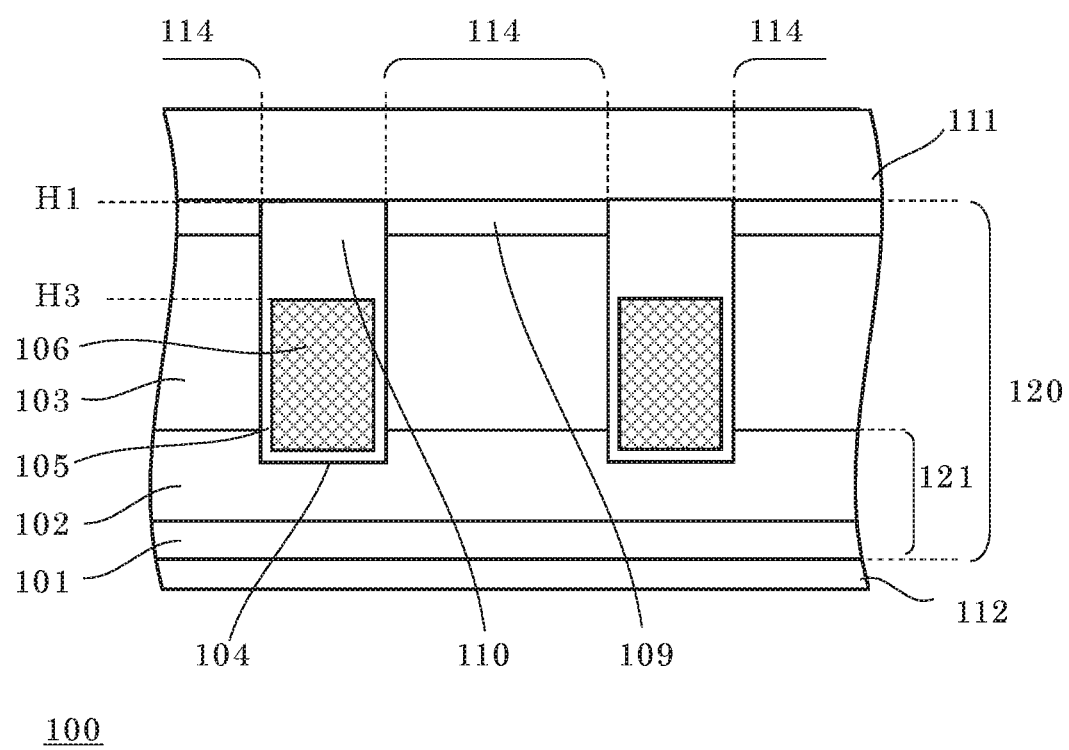
FIG. 4 is a sectional view taken along the line B-B' of the semiconductor device illustrated in FIG. 2.
Figure 5:
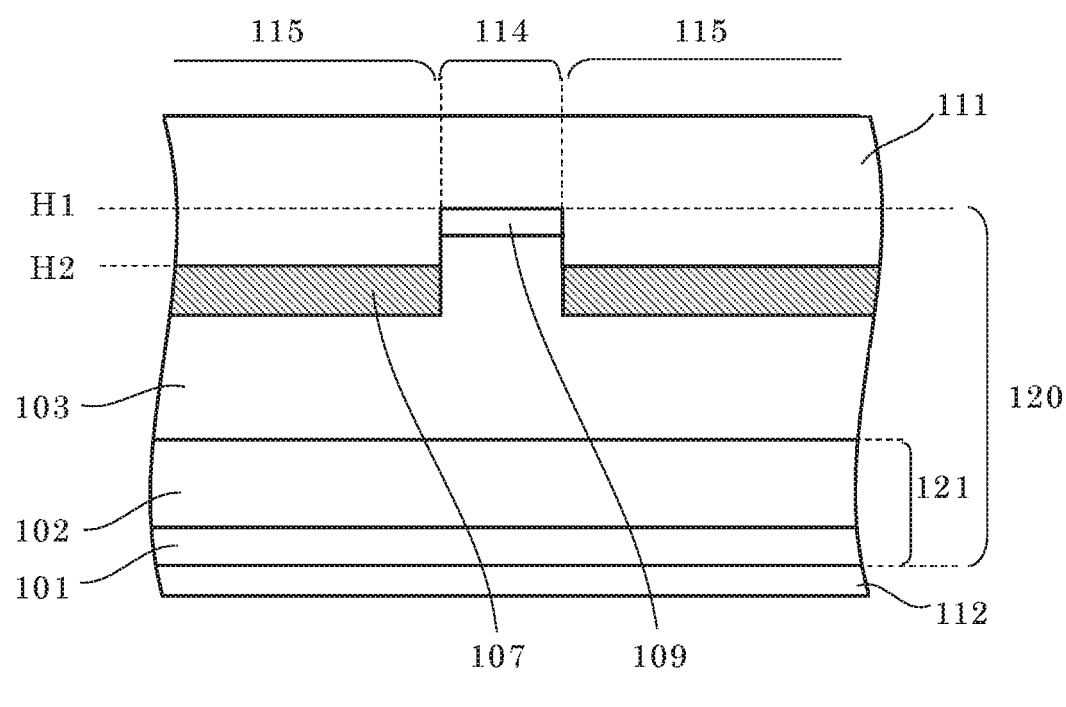
FIG. 5 is a sectional view taken along the line C-C' of the semiconductor device illustrated in FIG. 2.

FIG. 1 is a perspective view for illustrating a semiconductor device 100 including a vertical transistor according to a first embodiment of the present invention. Further, FIG. 2 is a plan view of the semiconductor device 100. FIG. 3 is a sectional view taken along the line A-A' of FIG. 2. FIG. 4 is a sectional view taken along the line B-B' of FIG. 2. FIG. 5 is a sectional view taken along the line C-C' of FIG. 2. Now, the semiconductor device 100 is described by taking a vertical N-channel MOSFET as an example.

As illustrated in FIG. 1, a source electrode 111 is formed on the surface of a semiconductor substrate 120 of the semiconductor device 100 according to the first embodiment, and a drain electrode 112 is formed on the back surface of the semiconductor substrate 120. In this manner, the semiconductor device 100 has a structure in which a current vertically flows.

The semiconductor substrate 120 includes a drain layer 121 formed of an N-type high-concentration region 101 and an N-type drift region 102 on its back surface side. The semiconductor substrate 120 also includes a P-type base region 103 formed on the drain layer 121.

The semiconductor substrate 120 has two surfaces having different heights. One of the two surfaces corresponds to a first surface which is positioned at a first height H1, and the other is a second surface which is positioned at a second height H2. The second height H2 is located at a position lower than the first height H1.

Trenches 104 each have a depth from the surface of the semiconductor substrate 120 to the drift region 102. In the trench 104, a gate insulating film 105 is formed on an inner side surface from the bottom surface of the trench 104 to a third height H3 which is lower than the second height H2. Inside the trench 104, a gate electrode 106 made from, for example, polysilicon, is embedded along the gate insulating film 105 to a position of the third height H3. Through application of a signal to the gate electrode 106, a channel is vertically formed along the outer side surface of the trench 104 in the base region 103.

An insulating film 110 is formed in a region of the trench 104 from the first height H1 to the third height H3, and electrically insulates the gate electrode 106 and the source electrode 111 from each other.

A P-type base contact region 109 is formed in a region from the first height H1 to a portion above the second height H2 of the semiconductor substrate 120. Further, the P-type base contact region 109 is in contact with the source electrode 111 at the first height H1, and fixes a potential of the base region 103 which is formed below the P-type base contact region 109 to a source potential.

An N-type source region 107 is formed in a region from the second height H2 to the third height H3 of the semiconductor substrate 120. The source region 107 is in contact with the source electrode 111 at the second height H2, and is in contact with the base region 103 at the third height H3. Further, the source region 107 and the base contact region 109 which are formed on a depth side of the drawing sheet of FIG. 1 along the trench 104 are formed at different heights, and hence the source region 107 and the base contact region 109 are not in contact with each other.

As illustrated in FIG. 2, on the surface of the semiconductor substrate 120 of the semiconductor device 100 according to the first embodiment, the trenches 104 are laid out in a stripe pattern in a vertical direction of the drawing sheet so as to extend long with a narrowed width linearly in one direction (in FIG. 2, the source electrode 111 is omitted). On the surface of the semiconductor substrate 120 between the trenches 104, a first region 114 having the first surface and a second region 115 having the second surface are alternately arranged along the trench 104.

In the first region 114, the P-type base contact region 109 is formed along outer side surfaces of the trenches 104. Further, in the second region 115, the N-type source region 107 is formed along the outer side surfaces of the trenches 104. All intervals X between the P-type base contact regions 109 arranged in the extending direction of the trench 104 (distance from one base contact region 109 to the next base contact region 109) are not required to be equal. However, it is desirable that the interval X is a certain limit value or less in order to stabilize the characteristics of the vertical N-channel MOSFET.

Further, in FIG. 2 for illustrating the first embodiment, all the first regions 114 and all the second regions 115 are arranged in the same pattern in a direction perpendicular to the extending direction of the trench 104. However, the pattern and arrangement are not necessarily limited to those in FIG. 2. For example, the first region 114 and the second region 115 may be alternately arranged via the trench 104 in the direction perpendicular to the extending direction of the trench 104.

The insulating film 110 is embedded to the upper part of the trench 104 to separate the first regions 114 and separate the second regions 115 which are arranged in the direction perpendicular to the extending direction of the trench 104.

FIG. 3 is a sectional view taken along the line A-A' which includes the second region 115 and the trench 104 of FIG. 2. The semiconductor substrate 120 of the semiconductor device 100 includes the drain layer 121 formed of the N-type high-concentration region 101 and the N-type drift region 102, the P-type base region 103, and the N-type source region 107. Further, the plurality of trenches 104 are formed in a lateral direction of the drawing sheet with a given interval. The source region 107 is formed between the trenches 104.

The N-type high-concentration region 101 serves as a drain of the vertical N-channel MOSFET, and has an impurity concentration of $1 \times 10^{20}/cm^3$ or more so as to obtain the ohmic contact with the drain electrode 112. Further, such a high impurity concentration decreases the resistivity and reduces the drain resistance.

Among the regions also serving as the drain of the vertical N-channel MOSFET the N-type drift region 102 is a region to secure drain breakdown voltage. In accordance with the desired value of drain breakdown voltage, the impurity concentration and a vertical thickness are determined.

The P-type base region 103 is a region in which a channel of the vertical N-channel MOSFET is to be formed. The impurity concentration and the vertical thickness of the base region 103 are determined by a desired threshold voltage or the drain breakdown voltage. The base region 103 is formed by implanting P-type impurities through the surface of the semiconductor substrate 120 into the N-type region in which the drift region 102 is to be formed, to thereby reversing the conductivity type. The base region 103 has thus the impurity concentration higher than that of the drift region 102.

The trench 104 is formed so as to have a depth from the second surface of the semiconductor substrate 120 which is positioned at the second height H2 to the upper surface of the drift region 102. Inside the trench 104, the gate insulating film 105 is formed on the inner side surface from the bottom surface of the trench 104 to the position of the third height H3. Further, inside the trench 104, the gate electrode 106 made from, for example, polysilicon, is embedded along the gate insulating film 105 to the position of the third height H3. The insulating film 110 is formed on the gate insulating film 105 and the gate electrode 106, and electrically insulates the gate electrode 106 and the source electrode 111 from each other. Application of a signal to the gate electrode 106 forms the channel vertically in a region along the outer side surface of the trench 104 in the base region 103.

The insulating film 110 is formed from the third height H3 of the trench 104 via the second height H2 at which the second surface of the semiconductor substrate 120 is positioned to the first height H1 at which the first surface of the semiconductor substrate 120 is positioned. Side surfaces of the insulating film 110 which are positioned above the second height H2 are each formed so as to be coplanar with an extension of the inner side surface of the trench 104, and are in contact with the source electrode 111.

Such structure can be obtained in the following manner. First, the trenches 104 are formed from the first surface of the semiconductor substrate 120, and the gate insulating film 105 is formed. Then, the gate electrode 106 and the insulating film 110 are embedded into the trench 104, and the surface of the semiconductor substrate 120 is etched from the first height H1 to the second height H2.

The source region 107 is formed on the base region 103, and a portion at the second height H2 (upper surface) of the source region 107 is in contact with the source electrode 111. The impurity concentration in a surface in contact with the source electrode 111 of the source region 107 is set to a concentration of $1 \times 10^{20}/cm^3$ or more in order to obtain the ohmic contact with the source electrode 111. Further, the source region 107 has portions (side surfaces) which are in contact with the outer side surfaces of the trenches 104, and is uniformly formed between the adjacent trenches so that at least a lower-side portion (bottom surface) thereof reaches the position of the third height H3. With this structure, the current provided from the drain electrode 112 flows through the source region 107 into the source electrode 111 via the high-concentration region 101, the drift region 102, and the channel formed along the outer side surface of the trench 104 in the base region 103.

In the first embodiment, the source region 107 is formed so that high-concentration N-type impurities reach the third height H3 from the second height H2, and hence a source resistance can be set smaller than that in a case in which the high-concentration N-type impurities reach the third height H3 from the first height H1 by thermal diffusion. This is because lowering of the N-type impurity concentration by the thermal diffusion and increase in the depth of the source region 107 which is a current flowing direction can be suppressed.

The source electrode 111 is formed so as to cover the source region 107 and the base contact region 109 (not shown in FIG. 3), and fixes a potential of the source region 107 and a potential of the base contact region 109 to the source potential. The surface of the second region 115 and the surface of the insulating film 110 have different heights, and the source electrode 111 is formed so as to embed the irregularities. Thus, due to an anchor effect, high adhesiveness can be obtained between the source electrode 111 and the insulating film 110, and between the source electrode 111 and the semiconductor substrate 120. Meanwhile, the upper surface of the source electrode 111 is flat. When it is difficult to fill the irregular step and planarize the surface of the source electrode 111 by depositing single metal, the source electrode 111 may be formed of a combination of a high-melting-point metal and a metal, for example, Al or Cu. That is, only at a portion in which the irregular step is large, the high-melting-point metal is provided by performing the embedding of the high-melting-point metal and etching back thereof so that the surface of the source electrode 111 is planarized, and after that, the metal, for example, Al or Cu, is deposited. Such planarization of the outermost surface of the source electrode 111 suppresses physical damage due to stress concentration to the surface projecting portion during wire bonding or the like, and hence long-term reliability is enhanced.

FIG. 4 is a view for illustrating a state of a cross section including the first region 114 and the trench 104 taken along the line B-B' of FIG. 2. In the semiconductor substrate 120, the semiconductor device 100 includes the drain layer 121 formed of the N-type high-concentration region 101 and the N-type drift region 102, the P-type base region 103, and the base contact region 109. Further, the plurality of trenches 104 are formed in a horizontal direction of the drawing sheet with a given interval, and the base contact region 109 is formed between the trenches 104.

The trenches 104 are each formed so as to have a depth from the first height H1 at which the first surface of the semiconductor substrate 120 is positioned to the upper surface of the drift region 102. Inside the trench 104, the gate insulating film 105 is formed on the inner side surface from the bottom surface of the trench 104 to the position of the third height H3. Inside the trench 104, the gate electrode 106 made from, for example, polysilicon, is embedded along the gate insulating film 105 to the position of the third height H3. The insulating film 110 is formed on the gate insulating film 105 and the gate electrode 106, and electrically insulates the gate electrode 106 and the source electrode 111 from each other.

Inside the trench 104, the insulating film 110 is formed from the third height H3 to the first height H1, and the upper surface of the insulating film 110 is in contact with the source electrode 111.

The base contact region 109 has portions (side surfaces) which are in contact with the outer side surfaces of the trenches 104. The base contact region 109 is uniformly formed between the adjacent trenches so as to have a depth in which its lower-side portion (bottom surface) is positioned above the second height H2 (not shown in FIG. 4). Further, the upper surface of the base contact region 109 is in contact with the source electrode 111, and the lower surface of the base contact region 109 is in contact with the base region 103. An impurity concentration of a portion (upper surface) of the base contact region 109 which is in contact with the source electrode 111 is set to $1 \times 10^{20}/cm^3$ or more in order to obtain the ohmic contact with the source electrode 111.

With this structure, the base region 103 receives the source potential from the source electrode 111 via the base contact region 109, to thereby suppress an unintended operation of a parasitic element in the transistor, securing a stable MOSFET operation.

FIG. 5 is a view for illustrating a state of the cross section taken along the line C-C' of FIG. 2 which is near the trench 104 and includes the first region 114 and the second region 115 of FIG. 2.

The base contact region 109 is formed in the first region 114 formed on a projecting silicon step which is sandwiched between the second regions 115 having a small height. The base contact region 109 is formed so as to have a depth from the first surface positioned at the first height H1 to a position higher than the second height H2, and the bottom surface thereof is in contact with the base region 103.

In the second region 115, the source region 107 is formed, with a uniform depth, in a region below the second height H2 which is lower than the first height H1. The lower portion (bottom surface) of the source region 107 is in contact with the base region 103.

The source electrode 111 is provided on the semiconductor substrate 120 while being in contact with the first surface at the position of the first height H1 and the second surface at the position of the second height H2. The source electrode 111 supplies the source potential to the source region 107 and the base contact region 109. In particular, the base contact region 109 is in contact with the source electrode 111 also on right and left side surfaces thereof illustrated in FIG. 5 in addition to the first surface. Thus, even when the base contact region 109 has the small area in plan view, the base contact region 109 is stably fixed to the source potential.

Now, in order to demonstrate an effect of the first embodiment, a comparison to the related-art structure is described with reference to FIG. 16.

As described above, the base contact region 509 has a role to give the source potential to the base region 503. However, it is difficult to steadily fix the potential of a position which is away from the base contact region 509, for example, the base region being at a midpoint of the interval Y, to the source potential. This is because, through application of the drain voltage, a current based on, for example, impact ionization or leak that occurs at the PN junction between the base region and the drift region flows into the base contact region. As a result, as the interval between the occurrence position of the impact ionization or the leak and the base contact region increases, a base resistance component increases. Accordingly, a voltage rise with respect to the source potential is liable to occur at that position.

When the potential at a certain position of the base region is increased with respect to the source potential, an NPN parasitic bipolar transistor which is formed of a source region, a base region, and a drift region at that position is liable to operate. As a result, it is difficult to stabilize the characteristics of the vertical N-channel MOSFET. In order to prevent such instability, it is effective to reduce the base resistance by enlarging the base contact region or by reducing the interval in which the base contact region is formed (interval Y of FIG. 16) to a certain limit value or less, for example. However, this means that the source region needed for channel formation is sacrificed at the same time. Thus, it is required that the source potential is efficiently supplied to the base region while the base contact region 509 is made narrower as much as possible.

Further, when the source region 507 and the base contact region 509 are adjacently formed on the same plane, an undetermined region 530 whose net impurity concentration is lowered to have high resistance is formed around the PN junction due to mask alignment shift or the thermal diffusion. The undetermined region 530 makes the width of the effective base contact region 509 narrow as compared to a design value so that it becomes difficult to fix the potential of the base region to the source potential. Thus, the potential is not stabilized. In order to reliably secure a stable operation of the transistor, there is a need to set the base contact region 509 large in consideration of generation of the undetermined region 530. Meanwhile, since the generation of the undetermined region 530 leads to sacrifice of the source region 507, the width of the effective source region 507 is also made narrow as compared to the design value. This leads to the reduction in channel formation density in a trench extension direction and the increase in ON resistance of the transistor along with the reduction of the channel width by setting the above-mentioned base contact region 509 large in advance as described above.

Meanwhile, in the first embodiment, with the structure illustrated in FIG. 1 to FIG. 6, the source region 107 and the base contact region 109 are vertically separated from each other without increase in chip area in plan view. Thus, the generation of the undetermined region 530 illustrated in FIG. 16 can be suppressed.

In the first embodiment, with such suppression of the generation of the undetermined region, the source region 107 is effectively formed and the ON resistance of the transistor can be reduced. Further, the base contact region 109 is in contact with the source electrode 111 at the upper surface and the side surfaces. Thus, the base contact region 109 can stabilize the potential of the base region 103 with the area having a small width in plan view, thereby achieving a stable MOSFET operation.

Figure 6:
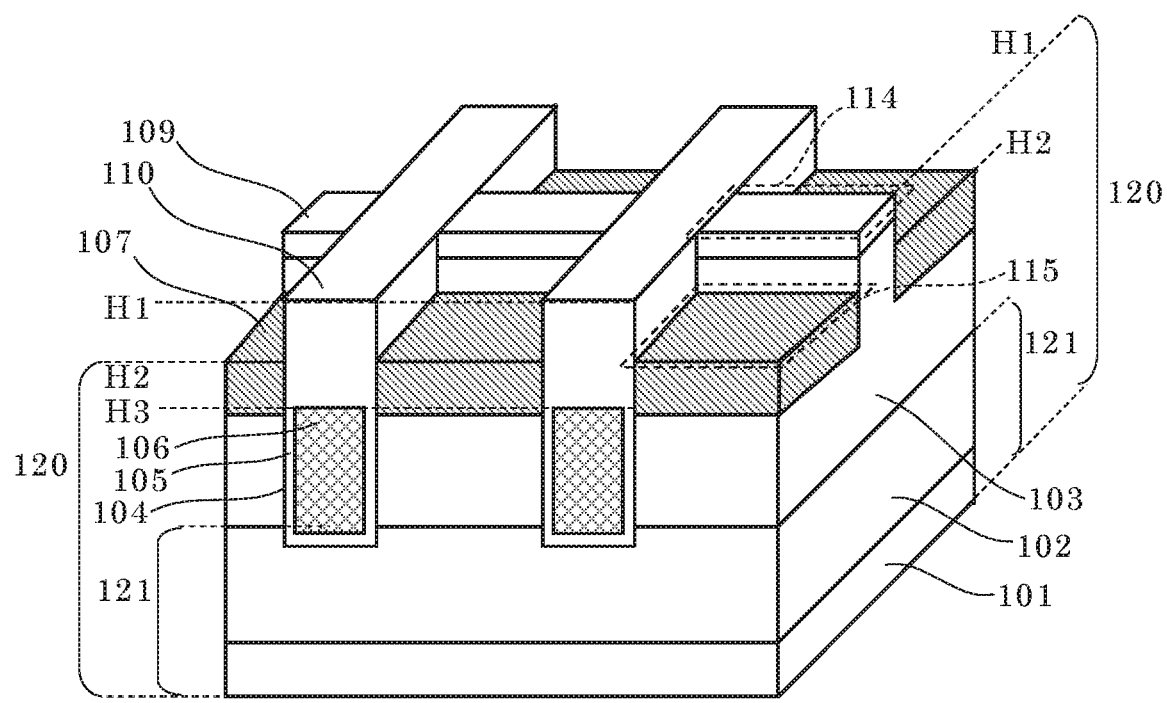
FIG. 6 is a perspective view for illustrating a portion of the semiconductor device according to the first embodiment in which a source electrode and a drain electrode are omitted.

FIG. 6 is a perspective view of the semiconductor device 100 including the vertical transistor, for illustrating a simplified semiconductor substrate 120 in which the source electrode 111 and the drain electrode 112 are omitted from FIG. 1.

As illustrated in FIG. 6, in the surface of the semiconductor substrate 120, the trenches 104 are laid out in a stripe pattern. The trenches 104 are alternately in contact with the first region 114 and the second region 115 which are formed along the trenches in its extension direction and have different heights. The base contact region 109 is formed on the first surface of the first region 114, and the source region 107 is formed on the second surface of the second region 115. The source region 107 and the base contact region 109 do not have the surfaces which are in contact with each other. The insulating film 110 is formed in a region that is located on the gate electrode 106 and between the third height H3 and the first height H1.

As described above, in the first embodiment, the source region 107 and the base contact region 109 are vertically separated from each other and are not in contact with each other so that the generation of the undetermined region around the PN junction between the source region 107 and the base contact region 109 can be suppressed. As a result, the size in the trench extension direction can be reduced.

Further, the width of the source region 107 can be increased to form a channel by a narrowed width of the base contact region 109. Thus, the channel formation density in the trench extension direction can be increased to reduce the ON resistance of the transistor. Meanwhile, the suppression of the generation of the undetermined region can suppress an operation of the parasitic bipolar transistor so that the stabilization of the MOSFET operation can be achieved. Further, the source region 107 is formed in the first region 115 at the second height H2 which is lower than the first height H1, and a depth of the source region 107 is set small. Thus, the impurity concentration can be increased so that the source resistance can be reduced to reduce the ON resistance of the transistor. Further, such step caused by a local etching of the semiconductor substrate 120 enhances the adhesiveness of the source electrode 111 due to the anchor effect so that the long-term reliability can be achieved.

Next, with reference to FIG. 7 to FIG. 13, a manufacturing method for the semiconductor device according to the first embodiment is described by taking the vertical N-channel MOSFET as an example.

Figure 7:
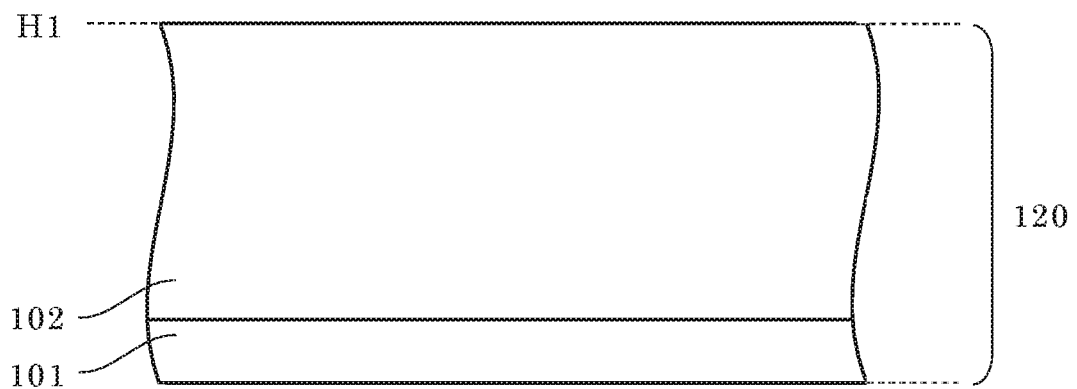
FIG. 7 is a sectional view for illustrating a manufacturing process for the semiconductor device according to the first embodiment of the present invention.

First, as illustrated in a sectional view of FIG. 7, the semiconductor substrate 120 which includes the N-type high-concentration region 101 and the N-type drift region 102 having the impurity concentration lower than that of the high-concentration region 101 is prepared. At this time point, the semiconductor substrate 120 has the surface having the same first height H1 at any position.

Figure 8:
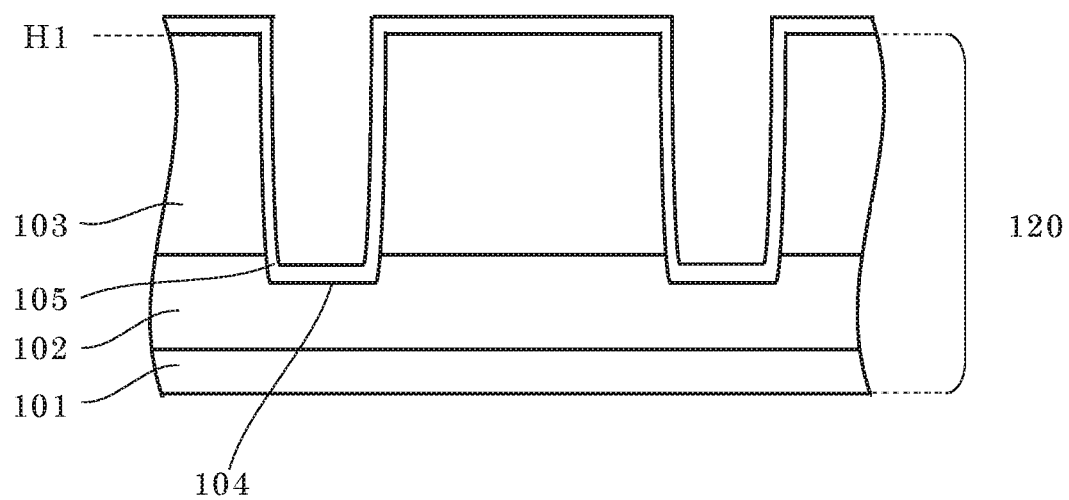
FIG. 8 is a sectional view for illustrating the manufacturing process for the semiconductor device according to the first embodiment of the present invention.

Next, as illustrated in a sectional view of FIG. 8, the P-type base region 103 is formed by ion implantation and thermal diffusion. Next, the trenches 104 are laid out in a stripe pattern in the surface of the semiconductor substrate 120 so as to have a depth reaching the upper surface of the N-type drift region 102. Next, the gate insulating film 105 is formed in the region including the inner side surface and the bottom surface of the trench 104.

Figure 9:
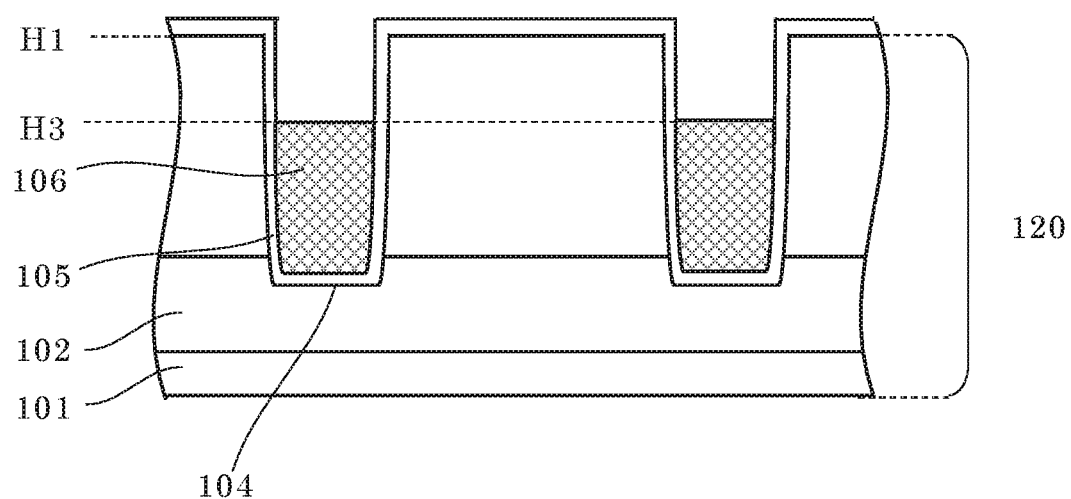
FIG. 9 is a sectional view for illustrating the manufacturing process for the semiconductor device according to the first embodiment of the present invention.

Next, as illustrated in a sectional view of FIG. 9, a polysilicon film is deposited so as to be embedded into the trench 104 without any gap, and the high-concentration impurities are introduced into the polysilicon film so that the polysilicon film has conductivity. Next, the polysilicon film is etched back to the third height H3 inside the trench 104 by partially removing the polysilicon film, to thereby form the gate electrode 106.

The order of the process so far is not limited thereto, and any order can be adopted as long as the manufacturing process can provide the structure illustrated in FIG. 9. For example, after the process of forming the trench 104, the process of forming the base region 103 may be performed.

Figure 10:
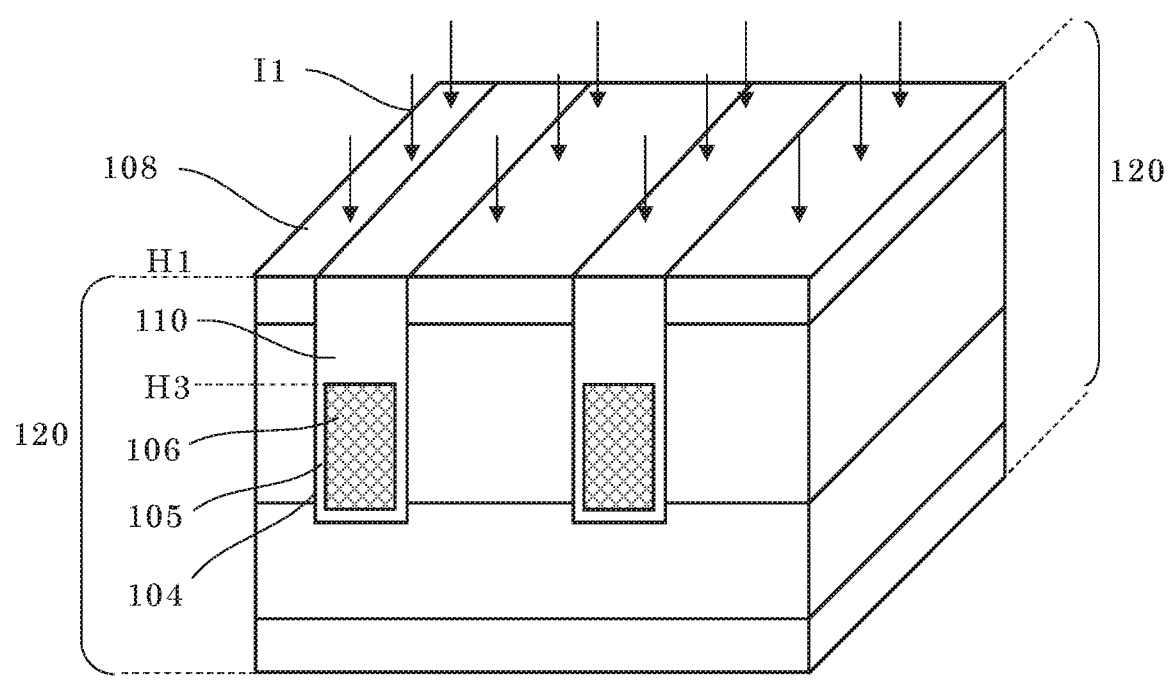
FIG. 10 is a perspective view for illustrating the manufacturing process for the semiconductor device according to the first embodiment of the present invention.

Next, as illustrated in a perspective view of FIG. 10, the insulating film such as a silicon oxide film or a silicon nitride film which is high in etching selectivity with respect to silicon etching to be performed later is deposited on the gate electrode 106 inside the trench 104 so as to be embedded without any gap. Next, the insulating film on the semiconductor substrate 120 is etched back to the first height H1 of the surface of the semiconductor substrate 120 inside the trench 104, to thereby form the insulating film 110.

Next, P-type impurity implantation for forming the base contact region is performed on the entire surface of the semiconductor substrate 120 as indicated by arrows I1, to thereby form a high-concentration P-type impurity layer 108. In order to obtain the ohmic contact with the source electrode formed on the upper surface later, the amount of impurity implantation is set so as to have the impurity concentration of $1 \times 10^{20}/\text{cm}^3$ or more on the surface of the high-concentration P-type impurity layer 108. Further, the amount of the P-type impurity implantation and a condition of the etch back for the above-mentioned polysilicon film are selected so that the bottom surface of the high-concentration P-type impurity layer 108 is positioned at a sufficiently higher position than the third height H3.

Figure 11:
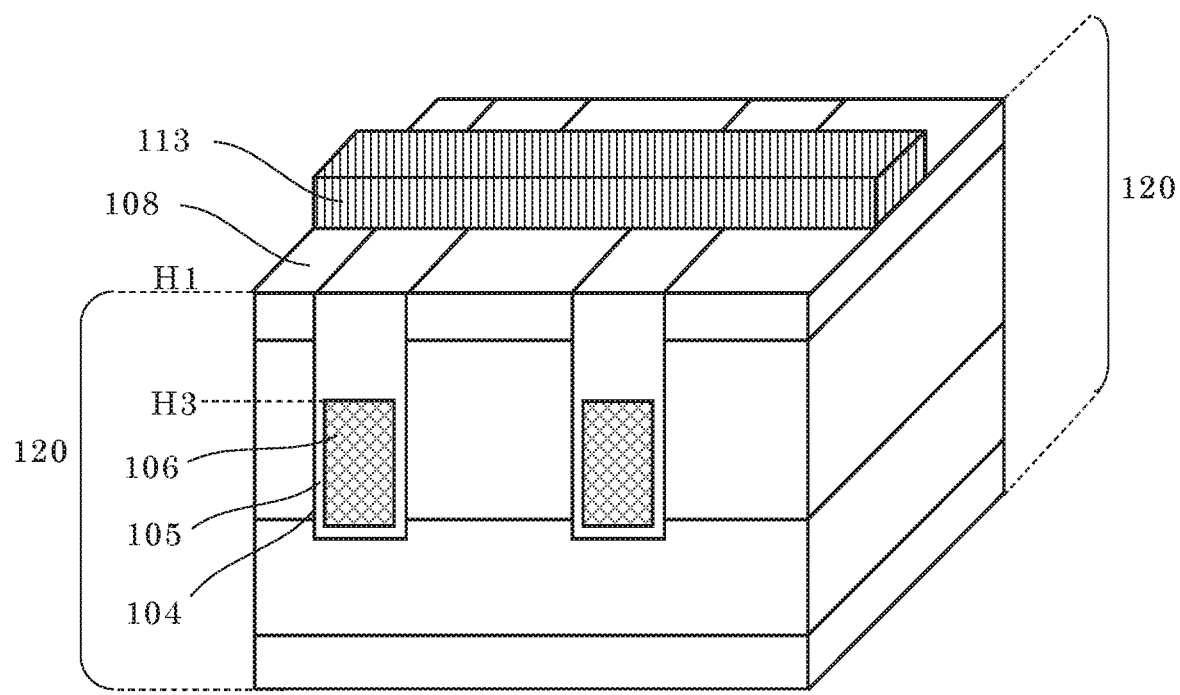
FIG. 11 is a perspective view for illustrating the manufacturing process for the semiconductor device according to the first embodiment of the present invention.

Next, as illustrated in FIG. 11, photoresist is applied to the entire surface of the semiconductor substrate 120, and a photoresist 113 is pattered by photolithography so as to cover a region to be formed into the base contact region later and the trench 104 to be adjacent to the base contact region. The photoresist 113 serves as a mask for performing silicon etching to be performed later. The mask is not limited to the photoresist, and may be an insulating film, for example, a silicon oxide film.

Figure 12:
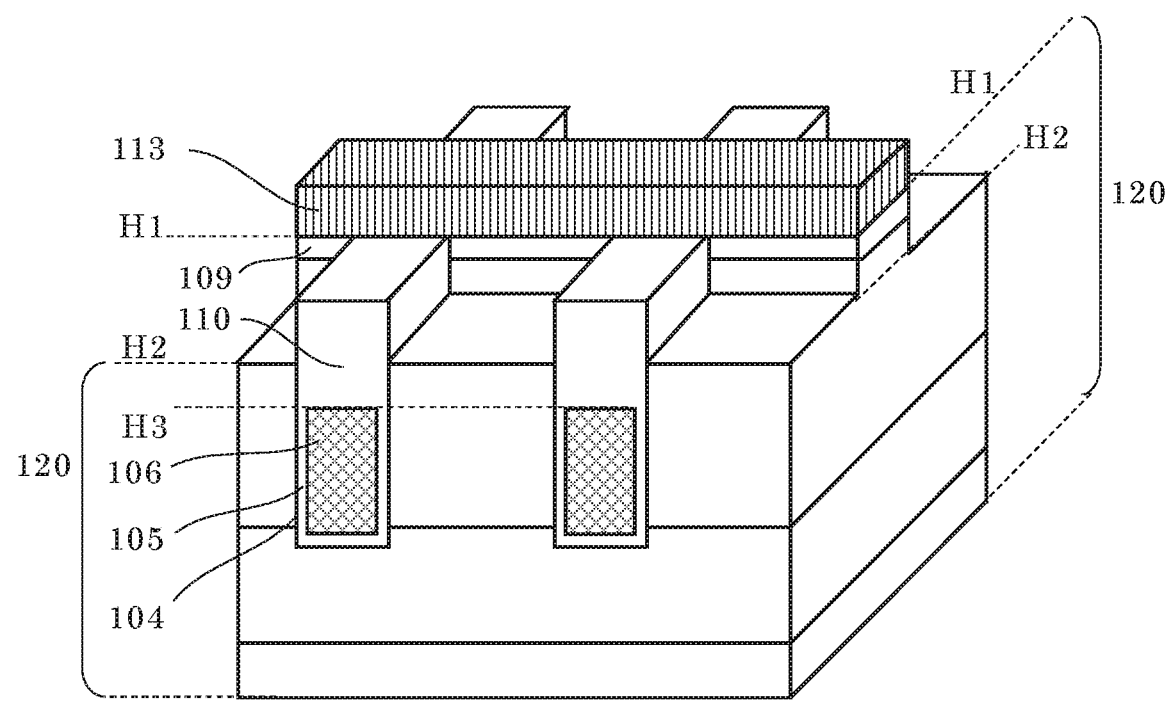
FIG. 12 is a perspective view for illustrating the manufacturing process for the semiconductor device according to the first embodiment of the present invention.

Next, as illustrated in FIG. 12, while the photoresist 113 is used as a mask, the exposed semiconductor substrate 120 is etched from the first height H1 to the second height H2 of the surface of the semiconductor substrate 120. At this time, the high-concentration P-type impurity layer which is not covered with the photoresist 113 is removed by the silicon etching, and the base contact region 109 is shaped. In order to achieve this, the second height H2 is set to a height which is higher than the third height H3, and is lower than the bottom surface of the base contact region 109. Further, the second height H2 is set to a height so that a resistance component of the source region which is formed later between the second height H2 and the third height H3 is sufficiently small. The surface of the semiconductor substrate 120 which is newly formed at the second height H2 by the silicon etching at this time corresponds to the second surface. The insulating film 110 is made from a material having a selectivity ratio with respect to the silicon etching, and hence the insulating film 110 remains without being etched so that the upper surface is kept at the first height H1.

Figure 13:
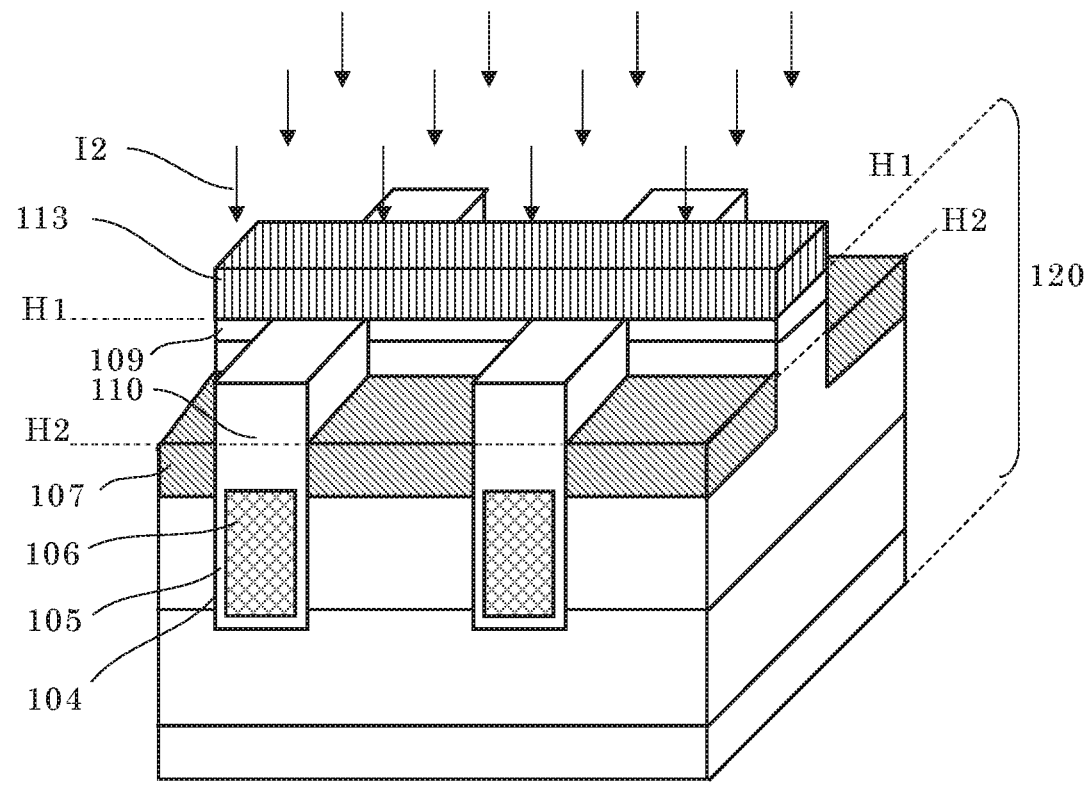
FIG. 13 is a perspective view for illustrating the manufacturing process for the semiconductor device according to the first embodiment of the present invention.

Next, as illustrated in FIG. 13, without the photomask process, the N-type impurity implantation is performed while the photoresist 113 remains, to thereby form the source region 107. In order for the second surface on which the source region 107 is formed to obtain the ohmic contact with the source electrode to be formed on the upper surface later, the amount of impurity implantation is set so that the impurity concentration is $1 \times 10^{20}/\text{cm}^3$ or more. At this time, the insulating film 110 has side surfaces on an extension of the side surfaces of the trench 104, and hence the N-type impurity implantation indicated by arrows I2 of FIG. 13 is not blocked. However, when there is a concern about uniformity of the implantation on the second surface due to, for example, an angle variation during implantation and an inclination implantation for preventing channeling, a plurality of times of implantation with directions changed or a rotary implantation may be adopted.

After that, the photoresist 113 is removed, and heat treatment is performed for activation of the impurities as needed. In this manner, the configuration illustrated in FIG. 6 can be obtained.

Next, although not shown, the source electrode is formed on the entire surface of the semiconductor substrate. After that, the drain electrode is formed on the entire back surface of the semiconductor substrate. As described above, there may be adopted the following manufacturing method as a formation method of the source electrode. By embedding of the high-melting-point metal and etching back thereof, the high-melting-point metal is provided only to the step of the source electrode and the source electrode is planarized. After that, a metal such as Al or Cu is deposited.

In the manufacturing method described above, the gate electrode 106, the insulating film 110, the base contact region 109, and the source region 107 can be formed without the photolithography process. Thus, the reduction of the number of processes and suppression of increase in chip area due to design in consideration of manufacturing variation, for example, the mask alignment shift, are achieved, and hence a high cost reduction effect can be obtained.

In the silicon etching process of FIG. 12, the photomask for shaping the base contact region 109 is used. As illustrated in FIG. 11, the pattern of the photomask is formed in a perpendicular direction with respect to the trench extension direction, and there is no need to form a marginal region in consideration of, for example, the mask shift with the trench 104 or with the source region 107. For example, even when the photoresist 113 is shifted to a side or a depth side of the drawing sheet in FIG. 11, the base contact region 109 is merely moved to the side or the depth side in accordance with the shifted photoresist 113, and a total width of the source region is not changed. Thus, the ON resistance of the transistor is not affected.

Further, in the source region 107 formation process illustrated in FIG. 13, the source region 107 is formed by implanting the N-type impurities from the second height H2 near the gate electrode 106, and hence time for the thermal treatment process for diffusing the N-type impurities can be cut as compared to a case in which the N-type impurities are implanted from the first height H1 without the silicon etching.

As described above, with the manufacturing method illustrated in FIG. 7 to FIG. 13, it is possible to provide an inexpensive semiconductor device through reduction of the number of manufacturing steps and suppression of the chip area.

Figure 14:
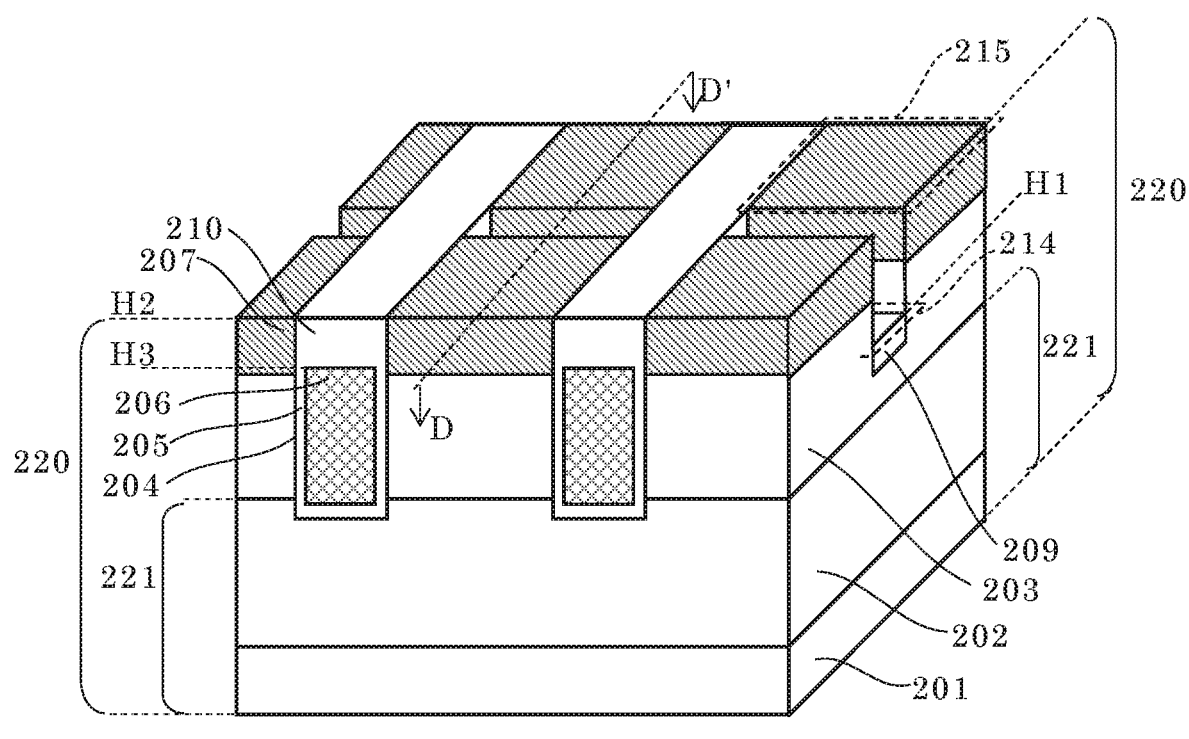
FIG. 14 is a perspective view for illustrating a portion of a semiconductor device according to a second embodiment of the present invention in which a source electrode and a drain electrode are omitted.

FIG. 14 is a perspective view for illustrating a semiconductor device 200 including a vertical transistor according to a second embodiment of the present invention (in FIG. 14, the source electrode and the drain electrode are omitted). As illustrated in FIG. 14, a semiconductor substrate 220 of the semiconductor device 200 includes a drain layer 221 formed of an N-type high-concentration region 201 and an N-type drift region 202, a P-type base region 203, and an N-type source region 207. Further, a plurality of trenches 204 are formed in a horizontal direction of the drawing sheet with a given interval.

The semiconductor substrate 220 has two surfaces having different heights. One is a second surface positioned at a second height H2, and the other is a first surface positioned at a first height H1. In the second embodiment, the second height H2 is positioned at a position higher than the first height H1.

The trenches 204 are layouted in a stripe pattern on the surface of the semiconductor substrate. A first region 214 of the first surface and a second region 215 of the second surface are alternately arranged along the trenches 204.

The trench 204 has a depth from the surface of the semiconductor substrate 120 to the drift region 202. Inside the trench 204, a gate insulating film 205 is formed on the inner side surface from the bottom surface of the trench 204 to the position of a third height H3. Inside the trench 204, a gate electrode 206 made from, for example, polysilicon, is embedded to the position of the third height H3 along the gate insulating film 205. Through application of a signal to the gate electrode 206, a channel is vertically formed along the outer side surface of the trench 204 of the base region 203. The third height H3 is lower than the second height H2, and is higher than the first height H1.

An insulating film 210 is formed in a region of the trench 204 from the second height H2 to the third height H3, and electrically insulates the gate electrode 206 and the source electrode (not shown in FIG. 14) from each other.

A P-type base contact region 209 is formed in a region of the semiconductor substrate 220 below the first height H1. Further, the P-type base contact region 209 is in contact with the source electrode (not shown in FIG. 14) at the first height H1, and fixes a potential of the base region 203 formed below the P-type base contact region 209 to the source potential.

The source region 207 is formed in a region from the second height H2 to the third height H3 of the semiconductor substrate 220. The source region 207 is in contact with the source electrode (not shown in FIG. 14) at the second height H2, and in contact with the base region 203 at the third height H3. Further, the source region 207 and the base contact region 209 which are formed on a depth side of the drawing sheet of FIG. 14 along the trench 204 have different heights, and hence the source region 207 and the base contact region 209 are not in contact with each other. The second embodiment is different from the first embodiment in that a height relationship between the source region 207 positioned at the first height H1 and the base contact region 209 positioned at the second height H2 is reversed. Further, the second embodiment is also different from the first embodiment in that the third height H3 at which the upper surface of the gate electrode 206 is positioned is higher than the first height H1 in conformity to the lower portion (bottom surface) of the source region 207.

A plan view of the second embodiment, in which the source electrode is omitted, is the same as FIG. 2. The trenches are laid out in a stripe pattern on the surface of the semiconductor substrate, and the first region including the source region and the second region including the base contact region are alternately arranged in its extension direction.

Figure 15:
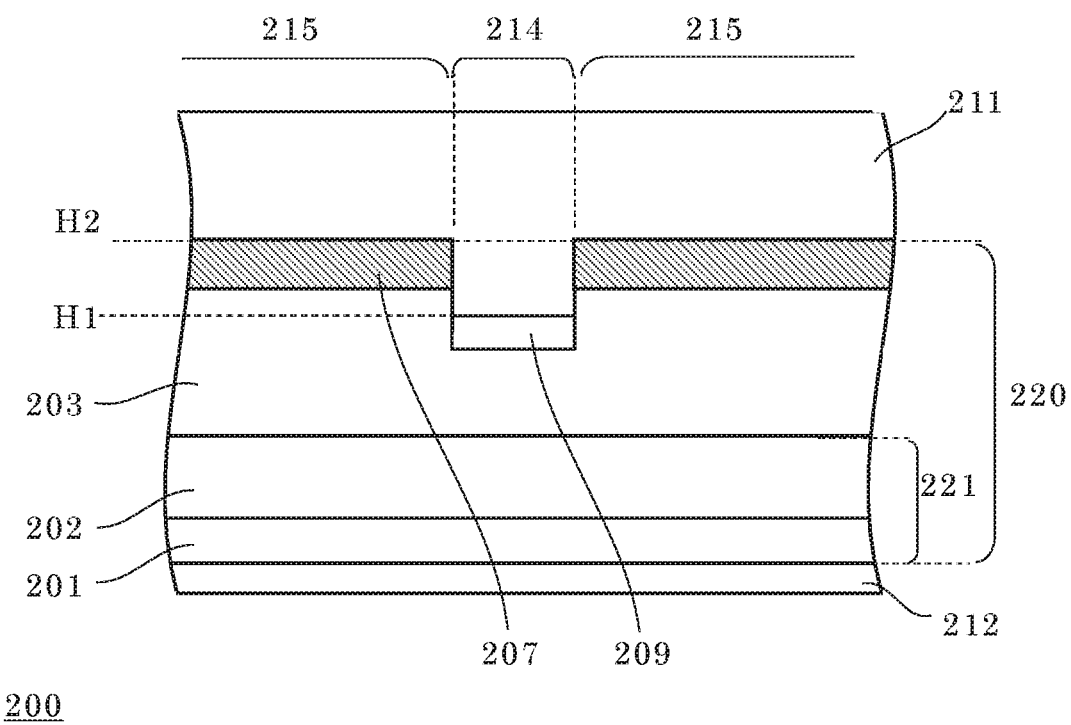
FIG. 15 is a sectional view taken along the line D-D' of the semiconductor device illustrated in FIG. 14.

FIG. 15 is a view for illustrating a state of a cross section taken along the line D-D' of FIG. 14 which includes the first region 214 and the second region 215.

In the first region 214, the base contact region 209 is formed on the first surface positioned at the first height H1. The base contact region 209 has a depth to a position which does not exceed the bottom surface of the base region 203, and the side surfaces and the bottom surface of the base contact region 209 are in contact with the base region 203.

In the second region 215, the source region 207 is formed on the first surface positioned at the second height H2, and has a uniform depth reaching at least the third height H3 (not shown in FIG. 15). The bottom surface of the source region 207 is in contact with the base region 203.

A source electrode 211 is formed on the semiconductor substrate 220 while being in contact with the first surface and the second surface which have different heights, and supplies the source potential to the source region 207 and the base contact region 209.

Figure 16:
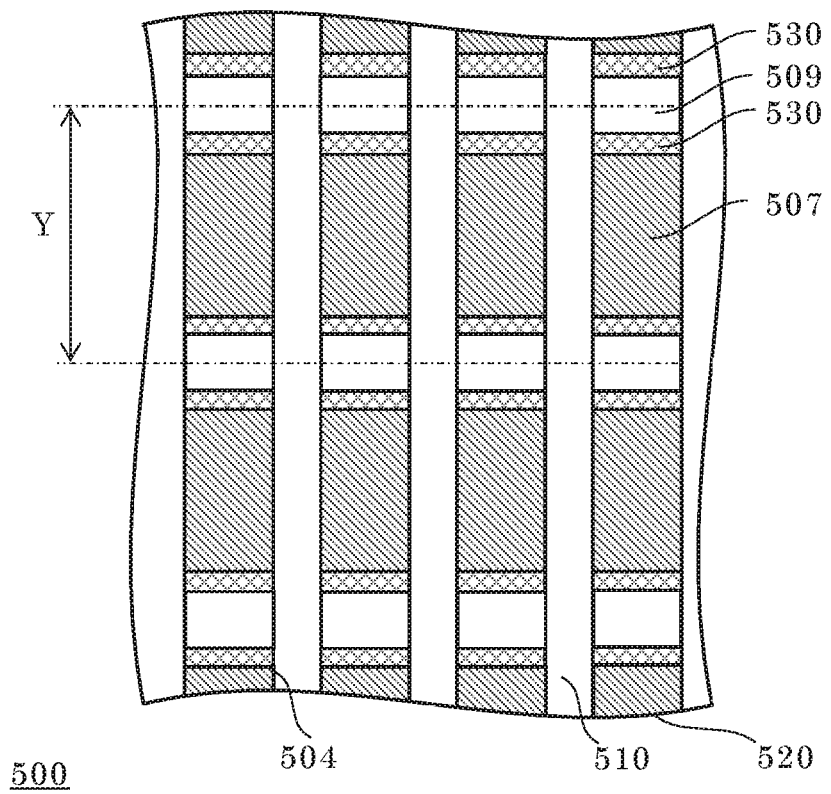
FIG. 16 is a view of a planar structure of a semiconductor device in which a source region and a base contact region are adjacent to each other, for illustrating a PN junction portion.

As illustrated in FIG. 15, also in the second embodiment, a region corresponding to the undetermined region 530 of FIG. 16 can be prevented from being formed without increase in chip area by vertically separating the source region 207 and the base contact region 209 from each other.

In FIG. 15 of the second embodiment, the base contact region 209 is embedded into the base region 203 and is deeper than the source region 207, and hence a fixation effect of the source potential with respect to the base region 203 is large. Thus, a suppression effect of an operation of an NPN parasitic bipolar transistor is high. With this, the width of the base contact region 209 is reduced, and the width of the source region 207 is increased. In this manner, even when the channel formation density in the trench extension direction is increased and the ON resistance is reduced, the stability of the MOSFET operation is not impaired.

As described above, in the second embodiment, the source region 207 and the base contact region 209 are vertically separated from each other. In this manner, the undetermined region around the PN junction between the source region 207 and the base contact region 209 can be suppressed, and hence the size in the trench extension direction can be reduced.

Further, the width of the source region 207 can be increased to form the channel by the narrowed width of the base contact region 209. Thus, the channel formation density in the trench extension direction can be increased to reduce the ON resistance of the transistor. Meanwhile, the suppression of generation of the undetermined region leads to the suppression of the operation of the parasitic bipolar transistor, to thereby achieve the stability of the MOSFET operation. Further, such step caused by a local etching of the semiconductor substrate 220 enhances the adhesiveness of the source electrode 211 by the anchor effect so that the long-term reliability can be achieved.

The structures of the first embodiment and the second embodiment described above are not limited to the vertical N-channel MOSFETs described above as examples, and it is understood that the structures can be applied to a vertical P-channel MOSFET by changing the polarity of the conductivity type. Moreover, the first and second embodiments can be applied to an insulated gate bipolar transistor by forming the high-concentration region having a conductivity type reverse to that of the drift region.

The present invention is not limited to the above-mentioned embodiments, and it is understood that various modifications can be made thereto without departing from the gist of the present invention. For example, in the first and second embodiments, the trenches are laid out in a straight stripe pattern, but the layout pattern of the trenches is not necessarily required to be straight, and the present invention can be applied as long as the trench extends in one direction.

What is claimed is:

1. A semiconductor device, comprising:
a semiconductor substrate having a first surface at a first height and a second surface at a second height different from the first height;
a first electrode on the first surface and the second surface in a contact manner; and
a second electrode on a back surface of the semiconductor substrate in a contact manner,
the semiconductor substrate further comprising:
a back surface semiconductor electrode layer of a first conductivity type having a predetermined thickness from the back surface of the semiconductor substrate;
a base region of a second conductivity type on the back surface semiconductor electrode layer;
a trench extending from the first surface and the second surface to an upper surface of the back surface semiconductor electrode layer;
a gate insulating film on a side surface and a bottom surface of the trench below a third height between the second surface and the bottom surface of the trench;
a gate electrode embedded in the trench to the third height along the gate insulating film;
an insulating film on the gate insulating film and the gate electrode inside the trench, and having an upper surface vertically extending to a higher position of the first height and the second height; and
a first region and a second region alternately situated along the trench and having the first surface and the second surface, respectively,
the first region having a base contact region of the second conductivity type, the base contact region including a portion in contact with the base region and a portion in contact with the first electrode, and having a concentration higher than a concentration of the base region,
the second region having a source region, the source region including a portion in contact with the base region, a portion along an outer side surface of the trench from the second surface to the third height, and a portion in contact with the first electrode,
wherein the base contact region is vertically separated from the source region by an intervening portion of the base region along a sidewall of the trench, such that the base contact region and the source region are not in contact with each other.

2. A semiconductor device according to claim 1, wherein the second height is lower than the first height, and is lower than the base contact region.

3. A semiconductor device according to claim 2, wherein the semiconductor device comprises an insulated gate bipolar transistor including a collector layer of the second conductivity type between the back surface semiconductor electrode layer and the second electrode.

4. A semiconductor device according to claim 1, wherein the first height is lower than the second height, and is lower than the source region.

5. A semiconductor device according to claim 4, wherein the semiconductor device comprises an insulated gate bipolar transistor including a collector layer of the second conductivity type between the back surface semiconductor electrode layer and the second electrode.

6. A semiconductor device according to claim 1, wherein the semiconductor device comprises an insulated gate bipolar transistor including a collector layer of the second conductivity type between the back surface semiconductor electrode layer and the second electrode.

7. A semiconductor device, comprising:

a semiconductor substrate having a first surface at a first height and a second surface at a second height different from the first height;

a first electrode on the first surface and the second surface in a contact manner; and a second electrode on a back surface of the semiconductor substrate in a contact manner, the semiconductor substrate further comprising:

a back surface semiconductor electrode layer of a first conductivity type having a predetermined thickness from the back surface of the semiconductor substrate;

a base region of a second conductivity type on the back surface semiconductor electrode layer;

a trench extending from the first surface and the second surface to an upper surface of the back surface semiconductor electrode layer;

a gate insulating film on a side surface and a bottom surface of the trench below a third height between the second surface and the bottom surface of the trench;

a gate electrode embedded in the trench to the third height along the gate insulating film;

an insulating film on the gate insulating film and the gate electrode inside the trench, and having an upper surface at any higher position of the first height and the second height; and a first region and a second region alternately situated along the trench and having the first surface and the second surface, respectively, the first region having a base contact region of the second conductivity type, the base contact region including a portion in contact with the base region and a portion in contact with the first electrode, and having a concentration higher than a concentration of the base region, the second region having a source region, the source region including a portion in contact with the base region, a portion along an outer side surface of the trench from the second surface to the third height, and a portion in contact with the first electrode, wherein the base contact region is separated from the source region by a portion of the base region along a sidewall of the trench underlying one of the base contact region and the source region, such that the base contact region has a height difference with respect to the source region, and the base contact region and the source region are not in contact with each other.

* * * * *